United States Patent [19]
Valdettaro

[11] 4,060,051
[45] Nov. 29, 1977

[54] INDICATOR SIMULATING A SEVEN-SEGMENT READOUT DEVICE

[75] Inventor: Alarico A. Valdettaro, Bloomington, Ind.

[73] Assignee: Sarkes Tarzian, Inc., Bloomington, Ind.

[21] Appl. No.: 658,706

[22] Filed: Feb. 17, 1976

[51] Int. Cl.² .............................................. H03J 1/04
[52] U.S. Cl. ........................... 116/124.1 A; 116/124.4
[58] Field of Search ................ 116/124.1 A, DIG. 29, 116/DIG. 31, 124.1 R, 124.4, 124.2 R, 124.3; 325/455; 40/130 E

[56] References Cited

U.S. PATENT DOCUMENTS

| 1,787,298 | 12/1930 | Ziola | 116/124.1 A |
|---|---|---|---|
| 2,058,641 | 10/1936 | Slonczewski | 116/124.1 A |
| 2,878,418 | 3/1959 | Garfinkel | 40/130 E |
| 3,545,114 | 12/1970 | Hurst | 40/130 E |
| 3,842,683 | 10/1974 | Valdettaro | 74/10.41 |
| 3,857,361 | 12/1974 | Gibson | 116/124.4 |
| 3,916,317 | 10/1975 | Gibson | 116/124.1 R |
| 3,916,820 | 11/1975 | Valdettaro | 116/124.2 R |
| 3,919,966 | 11/1975 | Saruwatari | 116/124.1 A |
| 3,924,209 | 12/1975 | Valdettaro | 325/457 |
| 3,943,883 | 3/1976 | Ishigami | 116/124.1 R |

Primary Examiner—James J. Gill
Assistant Examiner—Denis E. Corr
Attorney, Agent, or Firm—Mason, Kolehmainen, Rathburn & Wyss

[57] ABSTRACT

A digital display indicator for a television tuner utilizes a tape or other record medium having each of the television channel numbers disposed thereon in a seven-segment type font. A mechanism is provided for moving the tape past a display window to simulate a seven-segment digital display. In an alternative embodiment, the channel numbers may be displayed on one or more circular discs.

8 Claims, 8 Drawing Figures

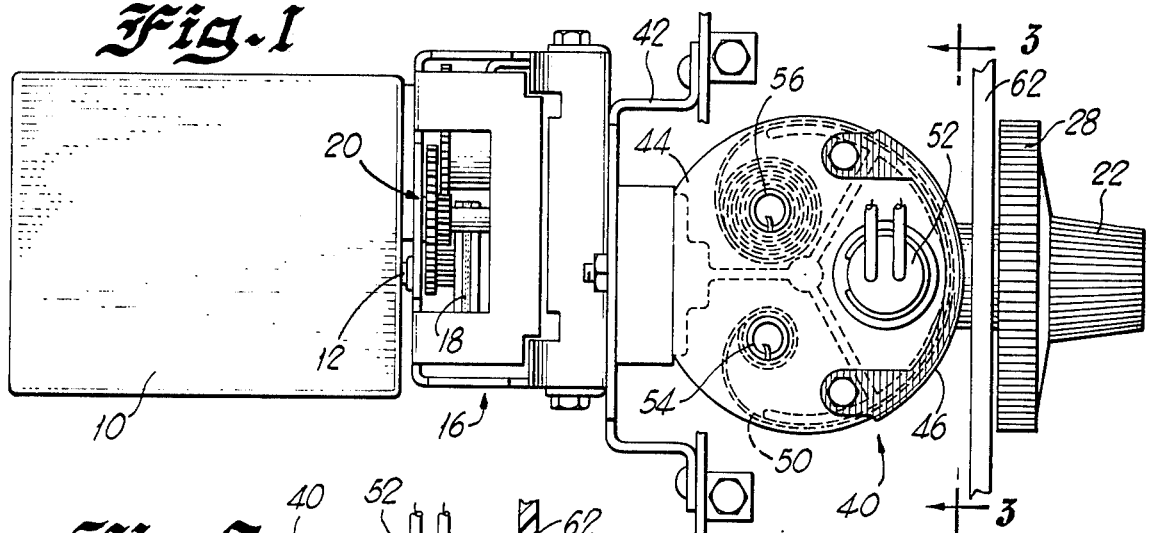
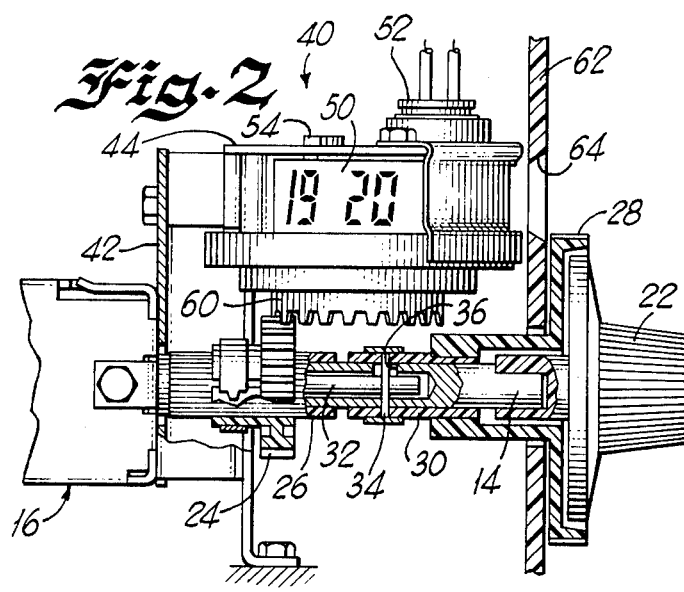
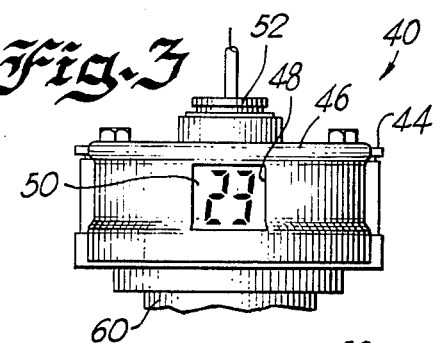
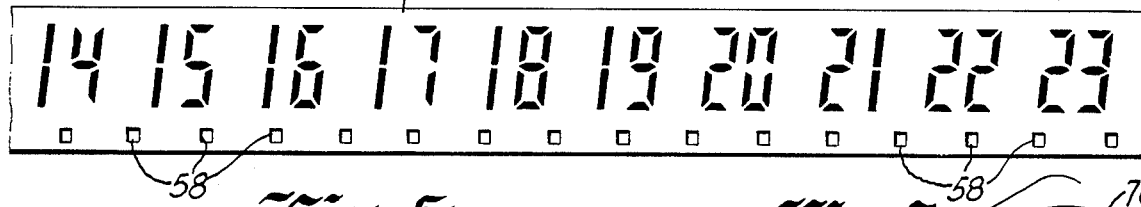
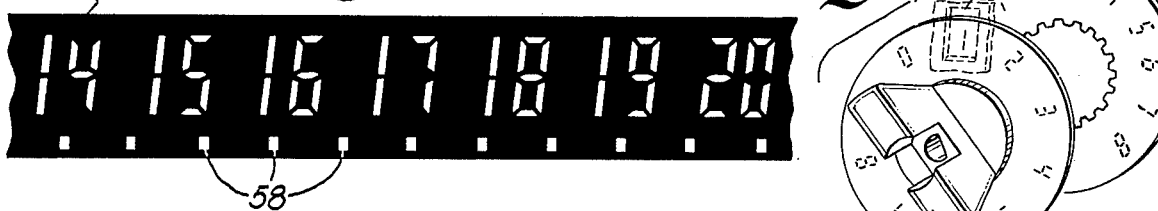
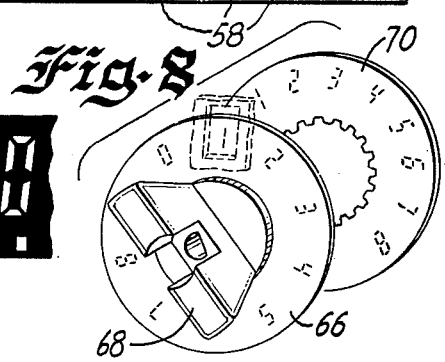

INDICATOR SIMULATING A SEVEN-SEGMENT READOUT DEVICE

BACKGROUND OF THE INVENTION

This invention relates generally to display indicators, and more particularly to digital display indicators that simulate a seven-segment digital readout.

In many instances, it is desirable to simulate the font generated by a seven-segment display for aesthetic reasons or to provide a consistent character font when a mixed display of seven-segment and conventional displays are used. Several displays that either provide or simulate a seven-segment digital display are known. Such displays range from true seven-segment displays that utilize electronic displays such as neon tubes or luminescent semiconductors to simulated seven-segment displays that use mechanical devices such as masks and mechanically movable segments which generate a segmented display when viewed through the mask. Two such mechanical display units are described in U.S. Pat. Nos. 3,683,523 and 3,721,087. Other systems such as the systems described in U.S. Pat. Nos. 3,836,911; 3,889,196; and 3,918,392 utilize fiber optics to generate a digital display, and systems such as the one described in U.S. Pat. No. 3,916,317 use a mask system to generate a simulated fiber optics display.

While the electronic devices, such as the neon tubes or luminescent semiconductors provide an attractive and readable display that may be viewed without external lumination, the neon tubes require a relatively high voltage power source, not readily available from transistorized circuitry, and both require relatively complex logic circuitry for selecting the segments to be illuminated. The mechanical display devices avoid the need for the logic circuitry, but require relatively complex mechanical cams and linkages for properly positioning the segments to generate the desired numbers. These cams and linkages are relatively costly and subject to failure. The fiber optics systems also tend to be relatively costly and complex.

SUMMARY OF THE INVENTION

Accordingly, it is an object of the present invention to provide a digital display indicator that overcomes many of the disadvantages of the prior art indicators.

It is another object of the present invention to provide an improved digital display indicator that displays characters in a seven-segment type font.

It is yet another object of the present invention to provide a simulated seven-segment display indicator usable for television tuners.

It is still another object of the present invention to provide a simplified display indicator for providing digital indications with a simulated seven-segment display type font.

In accordance with a preferred embodiment of the invention, a plurality of seven-segment display characters are formed on an elongated film strip. The film strip is placed in a housing having a display window dimensioned to accept the largest number of characters to be displayed. An advancing mechanism is provided for advancing the film strip incrementally to position various characters or character groups within the display window. A light source is placed behind the film strip to illuminate the characters to simulate the effect of a neon tube or luminescent semiconductor. The color of the characters being displayed may be selected to simulate any type of seven-segment readout device. Alternatively, the characters may be disposed on a disc or cylinder or on a plurality of concentric discs or cylinders with one of the discs or cylinders containing the units digits and the other one of the discs or cylinders containing the tens digits.

DESCRIPTION OF THE DRAWINGS

These and other objects and advantages of the present invention will be best understood with reference to the following specification and drawings wherein:

FIG. 1 is a top view of a television tuner utilizing an indicator according to the present invention;

FIG. 2 is a side view of the indicator shown in FIG. 1;

FIG. 3 is a front view of the indicator shown in FIGS. 1 and 2;

FIGS. 4–7 are drawings of various film strips usable in conjunction with the indicator shown in FIGS. 1–3 illustrating the various types of character fonts that may be used; and FIG. 8 is a perspective view of an alternative embodiment of the invention.

DETAILED DESCRIPTION OF THE INVENTION

Referring now to the drawing, with particular attention to FIGS. 1 and 2, there is shown a UHF tuner utilizing a digital indicator for indicating the number of the channel to which the UHF tuner is tuned. Such an indicator is described in U.S. Pat. No. 3,916,820 issued to the same inventor and assigned to the same assignee as the present invention. The U.S. Pat. No. 3,916,820 is incorporated herein by reference.

The tuner illustrated in the figures comprises a UHF tuner 10 having a continuously variable tuning shaft 12 (FIG. 1) that is mechanically coupled to a channel selector shaft 14 (FIG. 2) by a detenting and gear reduction mechanism 16 that includes a clutch 18 and a plurality of gears 20. A detenting mechanism usable as the detenting mechanism 16 is described in U.S. Pat. No. 3,774,457, also incorporated herein by reference.

A channel selector knob 22 is attached to the selector shaft 14 and drives the UHF tuner 10 and mechanism 16 via the selector shaft 14 in a manner described in the U.S. Pat. No. 3,916,820. A gear 24 is concentrically coupled to the shaft 14 via a sleeve 26. The sleeve 26 is coupled to a detenting wheel (not shown) within the mechanism 16, and rotates in synchronism with the selector shaft 14.

A fine tuning knob 28 is coupled to a fine tuning shaft 30 which applies rotary motion to a centrally located internal fine tuning shaft 32 via a pin 34 that passes through an aperture 36 in the selector shaft 14. The pin 34 couples the fine tuning shaft 30 to the internally located shaft 32. Rotating the fine tuning knob 28 rotates the central shaft 32 to effect fine tuning of the tuner 10 in a manner described in the referenced U.S. Pat. No. 3,774,457; however, the rotation of the fine tuning knob 28 does not affect the position of the gear 24 nor the selector shaft 14.

An indicator 40 similar to the indicator described in the U.S. Pat. No. 3,916,820 patent is affixed to the mechanism 16 by means of a bracket 42. Briefly, the indicator 40 comprises a housing 44 that has an apertured mask 46 affixed to the front portion of the housing 44. The mask 46 has an aperture 48 of sufficient size to display a single one of a plurality of channel indicating numerals disposed on a film strip 50 or other record medium located within the indicator 40. The size of the aperture is selected to mask off all numerals except the one corresponding to the selected channel. In the embodiment shown, the channel indicating numbers range from 14 to 83 with one number corresponding to each UHF television station; however, the indicator may be used in conjunction with a VHF or other tuner. When the indicator is used with a VHF tuner, the numbers would range from 2 to 13, and suitable numbers may be selected to suit any desired application.

A light source 52, such as an incandescent lamp, is disposed within the housing 44 and positioned with the film strip 50 interposed between the light source 52 and the aperture 48 so that the channel indicating numeral within the aperture 58 is illuminated by the light source 52. Various colors of light source may be utilized to provide different effects, or various colors of record medium may be used.

The film strip 50 is wound in coils about a pair of spools 54 and 56. The film strip 50 is advanced by an advancing gear (not shown, but described in the referenced U.S. Pat. No. 3,916,820) that simultaneously rotates the spools 54 and 56 and engages sprocket holes 58 (FIGS. 4–7) in the film strip 50. The advancing mechanism is operated by a crown gear 60 extending below the indicator 40 and engaging the gear 24 so that the channel indicating numerals disposed on the film strip 50 are sequentially advanced through the aperture 48 as the selector knob 22 is rotated between adjacent detent positions. The indicator 40 is disposed behind a panel 62 forming part of the television cabinet. The panel 62 has an aperture 64 aligned with the aperture 48 of the indicator 40. In this manner, the entire indicator 40 and tuner 16 are hidden from view, and only the channel indicating number displayed in the aperture 48 is visible through the aperture 64.

In order to simulate seven-segment channel indicating numbers, each number corresponding to one of the channels in the UHF band, a plurality of numbers are disposed on the film strip 50 utilizing a seven-segment font (FIGS. 4–6). Several varieties of seven-segment font may be used, and variations including the use of a relatively opaque numeral disposed on a relatively translucent background (FIGS. 4 and 6) or the use of a relatively translucent numeral formed on a relatively opaque background (FIG. 5) may be employed. The use of a translucent numeral on an opaque background particularly lends itself to simulating electronic displays such as neon or light emitting diodes displays. Furthermore, such a display has the advantage that it can be made brighter than an electronic display simply by making the intensity of the light source 52 as bright as desired. By varying the color of the light source 52, or by varying the color of the translucent portion of the film 50 (FIG. 5), any type of electronic display can be simulated. For example, a neon display can be simulated by utilizing an orange light source or translucent area, while a light emitting diode display can be simulated by utilizing a red or green light source or translucent area. The use of opaque lettering on a translucent background is useful for simulating displays such as liquid crystal or similar displays.

Although there may be variations in the seven-segment format employed, such as the difference between the formats shown in FIGS. 4 and 6, it should be noted that each of the numerals is generated from two to seven individual segments. The segments are either substantially horizontal or substantially vertical, with some tilt being permitted for aesthetic effects; however, all of the horizontal segments are substantially parallel to each other and all of the vertical segments are either parallel or coaxial. The ends of the segments may be varied to obtain different effects, with the embodiment illustrated in FIG. 6 having essentially square ends and the embodiment illustrated in FIG. 4 utilizing segments having either diagonal or pointed ends. Seven segments are adequate to define each of the numeric characters from one to 10, but it may be desirable to add other segments if alphabetic characters are to be included.

The numerals may be formed on the film strip 50 in a variety of ways. For example, the numerals may be formed by drawing the numerals on an appropriate medium and then photographically reducing and transferring them to the film strip 50. This permits variations in the resulting display and permits the display to be tailored to suit various applications. Typical variations are illustrated in FIGS. 4 and 6. Alternatively, the numerals may be generated by photographing an actual seven-segment display and transferring the resultant images onto the film strip 50. This technique is useful when a realistic display is desired, and may also be used when it is desired to match the characteristics of an actual seven-segment display closely. Such close matching is useful when the indicator is to be used in conjunction with a nonstandard seven-segment display. In both cases, the resulting film strip 50 may employ either opaque numerals on a translucent or transparent background, or translucent or transparent numerals on an opaque background. The actual characters may be applied to the film photographically, or by printing or other methods, and alphabetical characters may be used as necessary in conjunction with, or in place of, the numerical characters illustrated in FIGS. 4–6.

Another one of the advantages of the display according to the invention is its flexibility with respect to the type of font that may be displayed. For example, in addition to the seven-segment font illustrated in FIGS. 4–6, a display simulating a fiber-optics display (FIG. 7) may be achieved by simply forming each of the segments forming the character from a plurality of dots. Again, variations in the shape of the character may be made, and the character may comprise either relatively opaque dots on a relatively translucent background or vice versa. In addition, the characters may be rotated on the film by 90° to permit the display 40 to be rotated 90° about the selector shaft 14 if it is desired to display the number next to rather than above the channel selector knob 22. A 180° reorientation of the numbers would permit the number to be displayed below the selector knob 22.

In addition to being usable with a strip type of indicator dial, the seven-segment character font may also be used in conjunction with a disc type of indicator dial such as the one illustrated in FIG. 8 and illustrated in greater detail in U.S. Pat. No. 3,842,683, also issued to the same inventor and assigned to the same assignee as the present invention, and incorporated herein by reference. In the embodiment illustrated in FIG. 8, a transparent units digit disc 66 is rotated in synchronism with a selector knob 68 similar to the selector knob 22. Seven-segment character font numerals 0–9 are disposed on the disc 66 and provide the units digits necessary to synthesize all of the numbers representing each of the television channels. A tens digits disc 70 is disposed adjacent to the disc 66 and contains the tens digits necessary to generate the necessary channel numbers, also in a seven-segment character font.

The disc 70 is advanced by an advancing mechanism (not shown in FIG. 8 but described in the U.S. Pat. No. 3,842,683) at one tenth of the rate of rotation of the disc 66. Consequently, each time the disc 66 is rotated one complete revolution, the disc 70 is advanced by one digit. The two discs may be viewed through an aperture similar to the aperture 64 in a panel similar to the panel 62 so that only one of the tens digits and one of the units digits is visible at any one time. The discs may be illuminated from behind so that one of the units and one of the tens digits will form an illuminated display for each of the channel numbers. In this manner, each of the channel numbers 2–83 may be synthesized from the ten units digits and from the tens digits 1–8.

Alternatively, instead of two concentric discs as illustrated in FIG. 8, two concentric cylinders (not shown) may be utilized with the units digits being disposed on one of the cylinders and the tens digits on the other of the cylinders. The cylinders would also be rotated in a 10:1 ratio and one of the cylinders viewed through the other. A single cylinder or disc containing numerals for all of the television channels could be employed, however, such a structure would be rather large and not suitable for certain, particularly portable, applications.

Obviously, many modications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A simulated seven-segment display comprising:
   a mask having a viewing aperture defined therein;
   a film strip having a plurality of numeric characters disposed thereon, each of said numeric characters having a segmented type font wherein each numeric character is formed from one or more of a predetermined number of possible segments arranged to consistently simulate a predetermined type of seven-segment digital display as the film strip is incrementally advanced, said predetermined possible segments comprising at least three substantially parallel horizontal segments spaced substantially vertically from each other, and at least four substantially vertical segments grouped in two spaced groups, each group containing two spaced, substantially coaxial segments, the segments of one of the groups being substantially parallel to the segments forming the other group, with the substantially horizontal segments being interposed between the two groups; and
   means for advancing said film strip past said aperture sequentially to align predetermined ones of said numeric characters with said aperture for viewing therethrough.

2. A simulated seven-segment display as recited in claim 1 further including a housing and a light source contained within said housing, said film strip being interposed between said light source and said aperture.

3. In a television tuner of the type having a channel selector shaft and means for establishing a plurality of detent positions on said selector shaft, each detent position corresponding to a single television channel, an indicator mechanism providing a unique digital indication of each channel with a simulated seven-segment display, said indicator mechanism comprising:
   an elongated record medium having a plurality of numbers disposed thereon, said numbers being formed on said record medium in a seven-segment type font wherein each number is formed from between two and seven of seven possible continuous elongated segments arranged to consistently simulate a predetermined type of seven-segment display as the record medium is incrementally advanced, said seven possible continuous elongated segments comprising three substantially horizontal, parallel continuous elongated segments spaced substantially vertically from each other, and four substantially vertical continuous elongated segments grouped in groups of two spaced groups, each group containing two spaced, substantially coaxial continuous elongated segments, the segments of one of the groups being substantially parallel to the segments forming the other group, and the horizontal segments being interposed between said groups;
   a mask having an aperture sized to display a single one of the channel indicating numbers, said mask being disposed adjacent to said record medium; and
   means for supporting a portion of said record medium adjacent to said mask, said supporting means including means mechanically coupled to said selector shaft for advancing said record medium past the aperture in said mask for sequentially displaying the channel indicating numbers corresponding to each of the selected channels.

4. An indicator mechanism as recited in claim 3 wherein the number of channel indicating numbers is equal to the number of channels selectable by the tuner, said channel indicating numbers being disposed on said record medium in numerical order.

5. An indicator mechanism as recited in claim 4 wherein said record medium is an elongated film strip.

6. An indicator mechanism as recited in claim 4 wherein said record medium is relatively opaque and said segments are relatively translucent compared to said record medium.

7. An indicator mechanism as recited in claim 4 wherein said record medium is translucent and said segments are relatively opaque compared to said record medium.

8. In a television tuner of the type having a channel selector shaft and means for establishing a plurality of detent positions on said selector shaft, each detent position corresponding to a single television channel, an indicator mechanism providing a unique digital indication of each channel with a simulated seven-segment display, said indicator mechanism providing:
   a record medium having a plurality of numbers disposed thereon, said numbers being formed on said record medium in a seven-segment type font, wherein each number is formed from between two and seven of seven possible continuous elongated segments arranged to consistently simulate a predetermined type of seven-segment display as the record medium is incrementally advanced, said seven possible continuous elongated segments comprising three substantially horizontal parallel continuous elongated segments spaced substantially vertically from each other, and four substantially vertical continuous elongated segments grouped in groups of two spaced groups, each group containing two spaced, substantially coaxial elongated continuous segments, the segments of one of the groups being substantially parallel to the segments forming the other group, and the horizontal segments being interposed between the two groups;

a mask having an aperture sized to display a single one of the channel indicating numbers, said mask being disposed adjacent to said record medium, wherein said record medium comprises first and second coaxially spaced discs, said first disc containing ten single digit numbers representing units digits, said second disc containing a predetermined number of single digit numbers representing tens digits, said indicator mechanism further including means for rotating said discs with respect to each other and to the aperture in said mask in order to rotate said first disc past said aperture at a first rate and to rotate said second disc past said aperture at a second rate substantially equal to one tenth of said first rate thereby successively to bring one number from each of said discs into alignment with said aperture, one number from each of said discs serving to define one of the channel numbers; and means for supporting said record medium adjacent to said mask, said supporting means including means mechanically coupled to said selector shaft for advancing said record medium past the aperture in said mask for sequentially displaying the channel indicating numbers corresponding to each of said selected channels.

* * * * *